United States Patent [19]

Nelson

[11] Patent Number: 5,017,782

[45] Date of Patent: May 21, 1991

[54] X-RAY DETECTOR FOR RADIOGRAPHIC IMAGING

[76] Inventor: Robert S. Nelson, 25511 El Conejo La., Laguna Hills, Calif. 92653

[21] Appl. No.: 163,395

[22] Filed: Mar. 2, 1988

Related U.S. Application Data

[63] Continuation-in-part of Ser. No. 47,028, May 5, 1987, Pat. No. 4,937,453.

[51] Int. Cl.$^5$ ............................................. G01N 23/04
[52] U.S. Cl. .......................... 250/327.2; 250/213 VT
[58] Field of Search ............ 250/213 VT, 484.1, 327.2

[56] References Cited

U.S. PATENT DOCUMENTS

| | | | |
|---|---|---|---|
| 4,602,154 | 7/1986 | Taniguchi | 250/227 |
| 4,691,232 | 9/1987 | Lange | 358/111 |
| 4,737,641 | 4/1988 | Lange et al. | 250/484.1 B |
| 4,750,045 | 6/1988 | Ohara et al. | 358/481 |
| 4,816,679 | 3/1989 | Sunagawa et al. | 250/484.1 B |

OTHER PUBLICATIONS

Tsoulfanidis, "Measurement and Detection of Radiation", McGraw-Hill Book Co., N.Y., 1983, pp. 208-210.

Janesick et al., "The Future Scientific CCD", SPIE vol. 501, pp. 2-31, 1984.

Primary Examiner—Carolyn E. Fields
Attorney, Agent, or Firm—Lyon & Lyon

[57] ABSTRACT

A method and apparatus for enhancing the optical readout efficiency of a storage phosphor medium used for x-ray detection is disclosed. A photoemissive cathode strip is utilized to convert optical photons emitted from the storage phosphor medium into photoelectrons. Additional photocathodes may be provided to emit photoelectrons from the photons which pass through the photoemissive cathode strip. Preferably a reflective backing on the additional photocathodes is provided to increase the collection efficiency. The photoelectrons are then directed to one or more output elements for collection and amplification. This invention is particularly useful in conjunction with a point or line scan format of readout. Optical detectors are constructed and arranged such that a substantial fraction of the photo signal emitted by the storage phosphor medium in converted into an electronic signal. Weighting of output signal may be done. In another embodiment, optical photons form two storage phosphor screens are detected by a semiconductor photosensor which is optically sensitive on both sides.

12 Claims, 2 Drawing Sheets

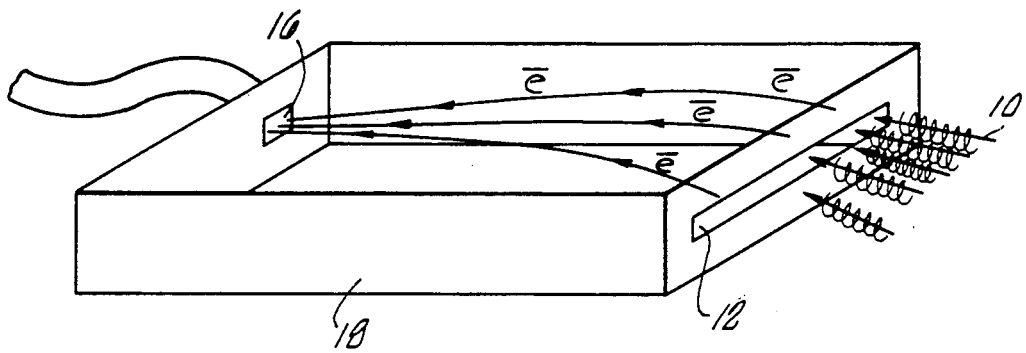
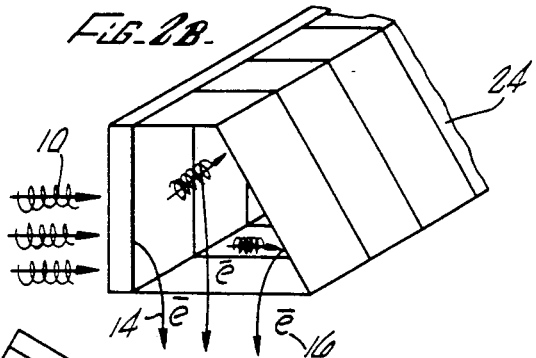
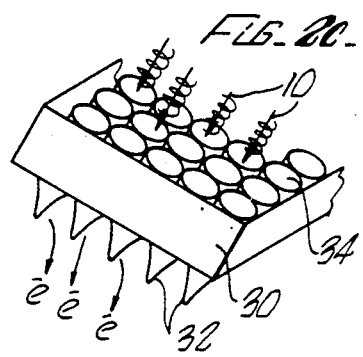
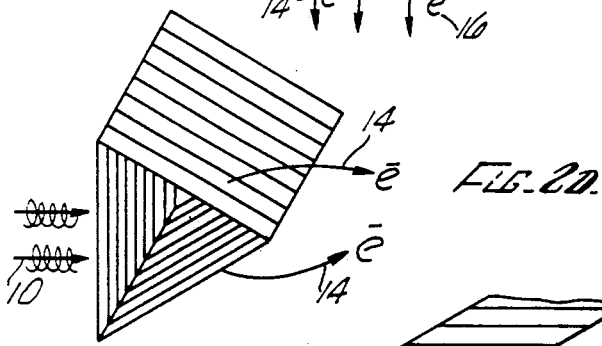
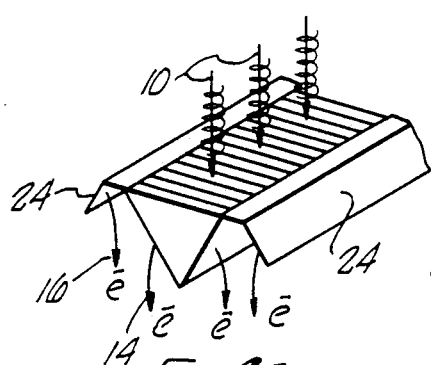
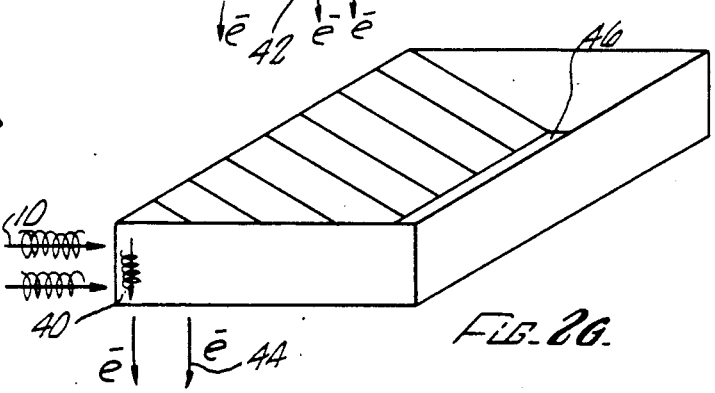

X-RAY DETECTOR FOR RADIOGRAPHIC IMAGING

RELATED APPLICATION INFORMATION

This application is a continuation in part of application Ser. No. 047,028 filed on May 5, 1987, now U.S. Pat. No. 4,937,453, entitled IMPROVED X-RAY DETECTOR FOR RADIOGRAPHIC IMAGING.

BACKGROUND OF THE INVENTION

Improvements on laser scanned storage phosphors systems have been described by Nelson, in the above referenced copending application, principally by increasing the thickness of the phosphor screen or the use of two screens to improve x-ray stopping power. In addition, methods of weighting the relative importance of the output signals collected during scanning by the two laser beams were described.

Problems arise due to the poor optical coupling efficiency between phosphor and photomultiplier tube through the use of a long, linear array of fiber optics. This may introduce additional noise into the signal if the storage phosphor has poor conversion efficiency from x-ray energy into an optical signal. In some cases a faster read out may be desired, which is possible with a line-scan format but difficult to achieve with a point-scan format and a single photomultiplier tube.

SUMMARY OF THE INVENTION

Improvements to the readout unit employed with one or more storage phosphor or stimulable phosphor screens are provided which simplify design and/or improve optical detection efficiency of the light from the photo-stimulable phosphor material. These improvements help maximize the probability of detecting the x-ray signal, especially at low levels of radiation intensity.

In one of the preferred embodiments, the storage phosphor screens are exposed in a normal manner. As is known, the storage phosphor screens are then scanned with laser light in order to stimulate emission of a photon. In accordance with this invention, a readout unit for a storage phosphor screen is comprised of one or more photocathode strips, a region where photoelectrons can be accelerated and focused, and an output element. The photocathode strips may be of a structured design and may preferably be backed by a reflective material to increase the detection efficiency. The region where the photoelectrons are accelerated and focused is maintained in a vacuum. The output element is preferably a single element or linear array detector (which may provide additional amplification). A single readout unit can then be used to scan a single screen or a dual readout unit can be used to scan two screens. The single screen or two screens having been previously exposed to x-rays. In the case of two screens, the screens can be separated after exposure for readout purposes. Several techniques can be implemented to weight the optical signals from the two screens, if desired.

In another embodiment of the invention, readout of two screens can be accomplished by a linear array of semiconductor photodetectors such as photodiodes or CCD(s) or a double sided photodetector unit. One embodiment of the double sided detector is a back-illuminated CCD which is optically sensitive from both front and back side, which can be used to simultaneously readout two screens. This readout format avoids the need for a vacuum container and can be compact. Optical filters or differences in quantum detection efficiency between the two sides of the photodetector can be exploited to weight optical signals from the two screens. Likewise, the intensities of the scanning laser beams can be weighted.

Thus, a principal objective of the present invention is to provide an improved readout unit for use with x-ray storage phosphor screens in which a large fraction of the optical signal from the de-stimulated storage phosphor is converted into an output signal for analysis.

Another object of the present invention is to provide a readout mechanism which allows two screens to be scanned simultaneously.

A further objective of this invention is to provide a means of weighting optical signals from the two screens.

BRIEF DESCRIPTION OF THE DRAWINGS

FIG. 1 shows a perspective view of a strip readout unit comprised of a vacuum chamber in which a long narrow photocathode strip is used to convert the optical signal from the laser-scanned storage phosphor screen into photoelectrons.

FIGS. 2a–2g show perspective views of several structured photocathode designs which enhance the probability of the optical signal from the storage phosphor to interact with the photocathode material.

DETAILED DESCRIPTION OF THE PREFERRED EMBODIMENTS

Figure 4:
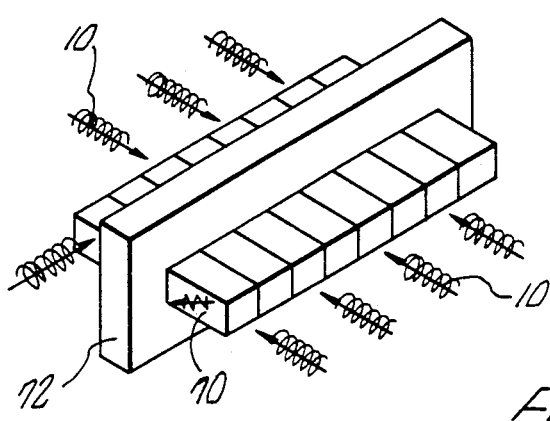
FIG. 4 shows a perspective view of a semiconductor photodetector with two optically active faces and appropriate light guides for two screen readout.

This invention relates to a method and apparatus for detecting optical radiation from a storage phosphor screen while the screen is scanned in a point or line scan format. In accordance with this invention, readout devices are constructed and arranged such that a substantial fraction of the optical signal from the screen is converted into an output signal suitable for analysis by analog or digital means. In this way a readout device is provided which promotes the conversion of optical into electrical signals while reducing the complexity of operation by limiting the number of output elements to one or a linear array of elements.

FIG. 1 shows a strip readout device for use in a point or line scan discharge of a storage phosphor screen of conventional or structured design, not shown. Optical photons 10 from the screen are converted by the photocathode material 12 into electronic signals (photoelectrons) 14. These photoelectrons 14 can be accelerated toward an output element 16, resulting in a net gain in energy. Electron optics, not shown, may be employed to map the photocathode onto the output element 16. The output element 16 may be selected from a variety of conventional means including:

1. electron amplification as is employed with photomultiplier tubes, 2. conversion by another phosphor into an optical signal which is then recorded by a photodetector, 3. bombardment of a CCD or other semiconductor device.

If minification is practiced, the output element 16 may have a much smaller area than its projection onto the photocathode 10. This promotes noise reduction in the output signal. In addition, if a single output element is used rather than a linear array, construction costs are greatly reduced although a point-scan format is then required.

Most of the assembly needs to be incorporated into a vacuum chamber 18. The photocathode strip 10 may be quite long, for example, up to approximately 50 cm long, but it is typically expected to be of relatively narrow width, for example, less than several millimeters. This is because the width of a line of the image is typically much less than one millimeter, i.e., spatial resolution is often in the range of from 1-8 line pairs per millimeter for medical imaging. Problems of structural integrity at the photocathode window are greatly reduced.

In comparison with the approach of using a fiber bundle to couple the phosphor screen signal to a photomultiplier tube, substantial benefit is derived by placing the photocathode material 12 very close to the phosphor screen to be read. The optical collection efficiency is much higher. Many storage phosphors are fairly weak scintillators in comparison to bright x-ray phosphors such as CsI:Na or $Gd_2O_2S$:Tb. Coupling with a long fiber bundle usually entails substantial optical losses which can seriously degrade the optical photon statistics and introducing additional noise into the output signal. (Reference: Nelson, R. et al., An Evaluation of a Fluorescent Screen-Isocon Camera System for X-Ray Imaging in Radiology, *Med. Phys.* 9(5):777, 1982).

Readout is ordinarily accomplished by laser scanning an entire line of the screen at once or by point scanning with a laser beam across a line. Relative motion is introduced between the screen and readout device in order to acquire an image.

Scanning a storage phosphor screen with a small readout device represents a practical approach to permitting the screens to be freely utilized throughout a radiology department or a factory setting. A further improvement in coupling efficiency between phosphor and photocathode can be made by incorporating both into an intensifier unit, not shown, with a two dimensional receptor area. This approach reduces the light losses encountered due to the small airgap between the phosphor screen and readout unit when they are separate units. The photocathode material may be deposited onto the phosphor medium or on an intermediate structural light guide. Typically, the laser or optical beam must scan from the same side of the phosphor material as x-rays are incident upon. A reflective coating could be applied to the scanned surface if the laser beam is properly polarized and incident to that surface at the Brewster angle. An alternative is to create a window in the vacuum housing to permit the laser beam to scan the phosphor screen from the vacuum side. The laser light must penetrate the photocathode material to discharge the phosphor. This dedicated unit benefits from simplified electron optics due to a single or linear array element output rather than a 2-D array element output.

FIGS. 2 *a-g* shows several embodiments which implement a structured photocathode. As shown in representative FIG. 2*a*, photons 10 will be incident on a photocathode window 22. Photoelectrons 14 will be emitted and focused by electromagnetic fields, not shown. Photons which pass through the photocathode window 22 may strike the back photocathode 24, which may also preferably contain a reflective material. Photoelectrons 16 will be emitted and focused as for photoelectrons 14. A vacuum is maintained in region 26.

Typical photocathode materials have a conversion efficiency less than 20% and often under 10%. The photocathode material must be applied as a very thin film to ensure that a photoelectron has a reasonable probability of escaping the material surface. Optical photons may have a high probability of being transmitted by the thin film photocathode 22. Introducing other photocathode structures, such as the back photocathode 24, present additional opportunities for the photoelectric process to occur.

Further improvement can be imparted to the structure by depositing onto the appropriate surfaces a reflective coating prior to deposition of photocathode material. Such a reflective coating may be a white paint or teflon covering a low index material such as magnesium fluoride, etc. or a metallic reflector (Al, Ag, etc.) covering a low index material. Optionally, the low index material alone could be applied to create an index of refraction mismatched at the photocathode material—low index material boundary. This creates an opportunity for an optical photon to make a double pass through the photocathode material.

FIG. 2*b* shows a structure similar to FIG. 2*a* in that it has a front photocathode window 22 which serves to emit photoelectrons 14, and to transmit a portions of the photons 10 to the back photocathode and reflective surface 24. It will be appreciated that any structure which obtains the benefits of this invention may be employed, as known by those skilled in the art. The back photocathode is structured such that the walls between individual elements may be coated with photocathode material.

FIG. 2*c* shows an alternative embodiment comprising a plurality of tapered light guides 30. A tapered section 32 is coated with photoemissive material. Photons 10 from a storage phosphor device pass through a window 34 and are received by the various light guides 30. Photons 10 striking the photoemissive material 32 will cause photoelectrons 36 to be emitted. They may be focused and collected as discussed above in connection with FIG. 2*a*.

FIGS. 2*d* and *e* show two additional embodiments. The incident photons 10 from the storage phosphor screen generate photoelectrons 14 in the first pass, and other photoelectrons 16 from a second photocathode material 24.

Two embodiments are shown using structured light guides in FIGS. 2*f* and *g*. Photons 10 from the storage phosphor screen, not shown, are incident on a structured light guide 40. Photocathode material 42 may be used on the surface of the light guide 40. A reflector 44 coated with photoemissive material may be employed. In the case of FIG. 2*g* a continuous structure 46 is provided to the rear wall of the detector. By redirecting light to an internal photocathode, simplify the design of the vacuum—window interface and by providing a continuous structure to the rear wall, improved performance results. It will be appreciated that there is no vacuum directly behind the entrance window.

The structure of the photocathode may influence the degree of cross talk between adjacent elements at the input. This can thus influence the choice between a point or line scan readout format since spatial resolution would be degraded.

The units described in FIGS. 1 and 2a-g could be used to readout a pair of storage phosphorous screens. The output signals could be weighted and combined or digitized and analyzed as in dual energy imaging.

Figure 3:
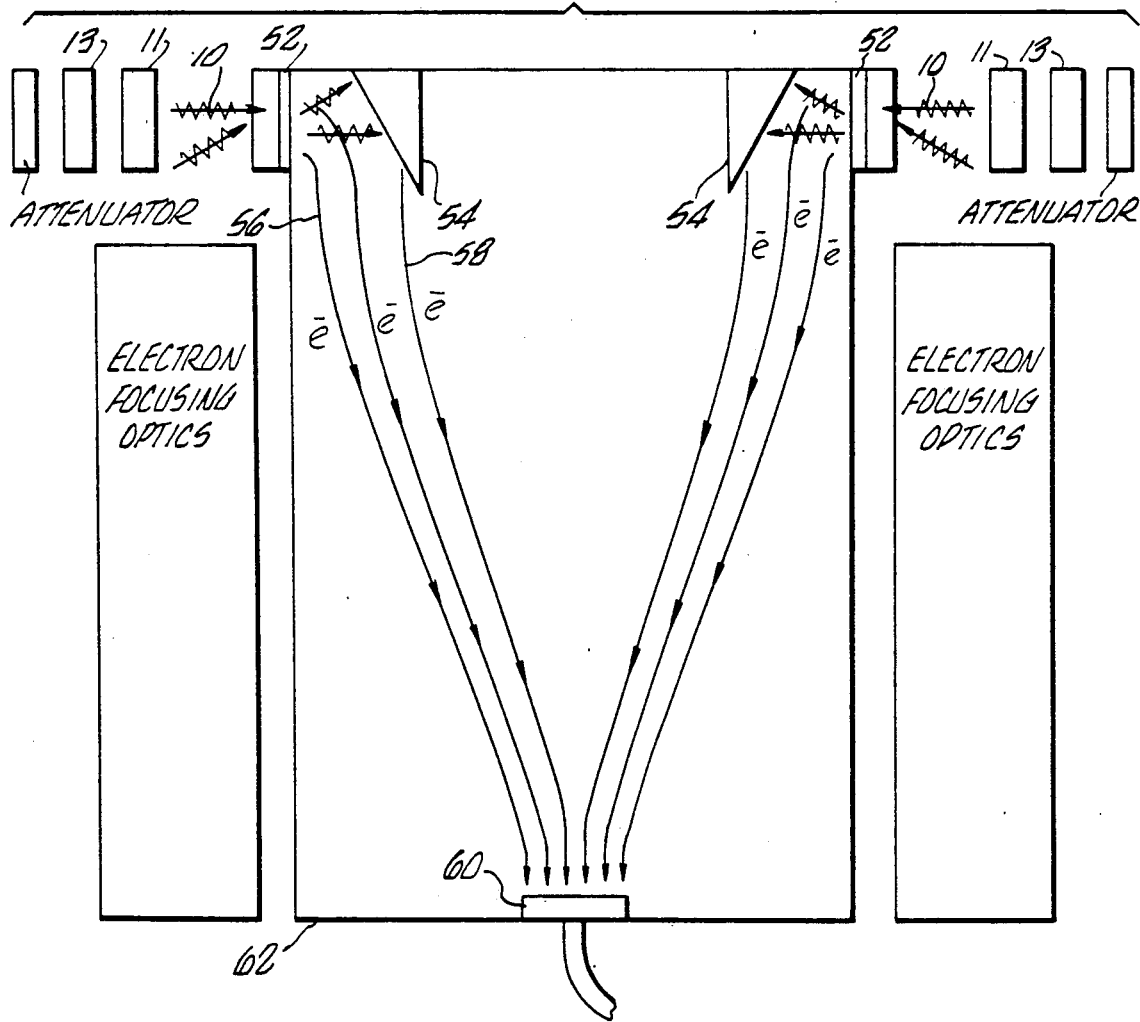
FIG. 3 shows a perspective view of a readout unit which permits two screens to be scanned at one time.

As shown in FIG. 3, this invention may be advantageously used to scan two screens simultaneously. Photons 10 from a storage phosphor screen 13, are incident on two or more photocathode windows 52. Photoelectrons 56 are emitted and focused by electromagnetic fields, not shown. Photons which pass through the photocathode windows 52 may be incident on photocathode material and reflector 54. Photoelectrons 58 are emitted and focused as for photoelectrons 56. An output element 60 is provided to detect the photoelectrons 56, 58. A vacuum housing 62 is provided.

The advantage of such a structure is that the photoelectric signals from corresponding elements 52, 54 in the two screens can be combined at the output element 60 or output element array. Various means of weighting the signals from the screens could be implemented:

(a) adjust the relative intensities of the scanning laser beams, (b) introduce or incorporated a variable optical filter 11 between the back screen and the readout device, (c) adjust the accelerating potential difference between the output element(s) and the two photocathode units, thereby provide unequal gain, or (d) use separate output element(s) with adjustable amplification before combining the two signals.

Option d reduces simplicity in comparison to the use of a single output element or single array of output elements. Also, an increase in readout noise may occur. This approach is not much different from using two separate readout units and combining their outputs. This approach permits dual energy analysis and is not limited to simple weighting of signals before combining.

Figure 5:
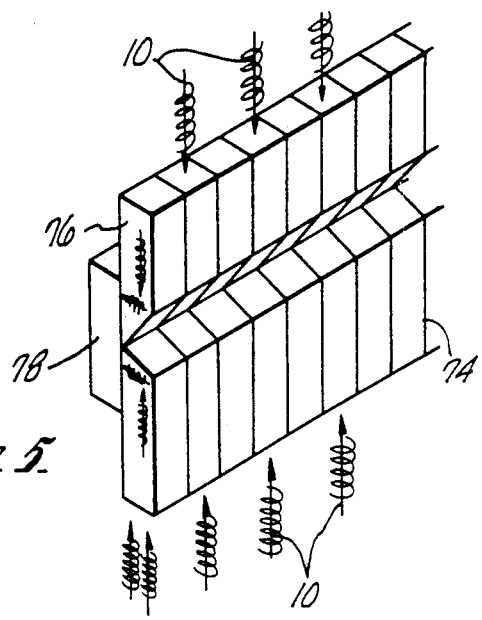
FIG. 5 is a perspective view of a semiconductor photodetector with a single active side.

FIGS. 4 and 5 show several means of scanning two screens using a readout device based on semiconductor photodetectors. The readout device is compact and does not require a vacuum structure. Filters can be introduced to limit interactions of the scanning beam with the semiconductor detector if needed. Filtration may also be added to weight signals from the two screens. The intensity of the scanning beams could also be adjusted appropriately as a means of weighting signals from the screens. Optical attenuators could be utilized if the scanning beams originate from a common source. The use of two lasers permits electronic adjustment of beam intensity.

FIG. 4 employs a double sided semiconductor photodetector unit 72 such as a back-illuminated CCD with a photosensitive front side or two photodetectors with a common output. Appropriate light guides 70 such as fiber bundles are used to channel optical signals from the storage phosphor screen, not shown, to the photodetector. Ideally the distance between the screen and the photodetector is kept small so as to reduce light losses within the light guides.

FIG. 5 employs a single sided semiconductor photodetector 78 such as a photodiode, CCD or amorphous materials such as amorphous silicon with appropriate light guides, such as curved or angled fiber bundles 74, along with a second light guide 76 so as to form a dual readout unit.

An alternative to the use of a long continuous photosensor surface, or the abutment of photosensor units, is to create a continuous detector by abutment of the light guides. Nearest neighbor photosensor units are positioned on opposite sides of the continuous light guide structure. This format makes for easy replacement of a defective photosensor module.

What is claimed is:

1. A detector for optical photons from a storage phosphor medium comprising,
    a first photocathode, said first photocathode comprising means for receiving optical photons emitted from a storage phosphor medium, and
    a second photocathode arranged to receive photons passing through the first photocathode.

2. The detector of claim 1 wherein the second photocathode further comprises a reflective backing.

3. The detector of claim 1 further comprising a detector for sensing the photoelectrons emitted from the first and second photocathodes.

4. The detector of claim 1 further comprising a vacuum chamber.

5. An apparatus for the detection of optical photons emitted from two storage phosphor screens comprising:
    two strip photocathodes oriented relative to their respective storage phosphor screens,
    a single vacuum container with focusing electron optics and output element(s) common to both photocathode strips.

6. An apparatus for the detection of optical photons emitted from two storage phosphor screens upon irradiation by one or more scanning beams comprising:
    a semiconductor photosensor means for conversion of optical photons into an electrical signal,
    light guide means for transmitting the optical signals from the phosphor screens to the photosensor means and
    optical filter means for weighting the relative importance of signals from the screens.

7. The apparatus of claim 6 further comprising filter means for minimizing transmission of a scanning beam to the photosensor means.

8. The apparatus of claim 6 further comprising optical attenuator means to control one or more intensity of scanning beams.

9. An apparatus for the detection of optical photons emitted from two storage phosphor screens comprising:
    a semiconductor photosensor unit which is optically sensitive on both sides and in which the two sides share a common collection and amplification means and
    light guides comprising means for transmitting the optical signals from the phosphor screens to the optically active faces of the photosensor unit.

10. An apparatus as described in claim 9 in which the semiconductor photosensor unit is a double-sided detector.

11. An apparatus as described in claim 10 in which the double-sided detector is a back-illuminated CCD.

12. A detector for optical photons emitted from a storage phosphor medium employed for radiographic imaging comprising:
    a plurality of individual strip photocathode means structured for enhancement of conversion probability from optical photons emitted from a storage phosphor medium into photoelectrons,
    electron optic means for focusing the photoelectrons, and a vacuum container in which the photoelectrons are focused, and
    a detector for collecting at least a portion of the output of the photocathode means.

* * * * *